(12) United States Patent
Voss (10) Patent No.: US 6,252,818 B1
(45) Date of Patent: Jun. 26, 2001

(54) APPARATUS AND METHOD FOR OPERATING A DUAL PORT MEMORY CELL

(75) Inventor: Peter Voss, Aromas, CA (US)

(73) Assignee: SandCraft, Inc., Santa Clara, CA (US)

( * ) Notice: Subject to any disclaimer, the term of this patent is extended or adjusted under 35 U.S.C. 154(b) by 0 days.

(21) Appl. No.: 09/277,659

(22) Filed: Mar. 26, 1999

(51) Int. Cl.$^7$ ................................................. G11C 8/00
(52) U.S. Cl. ................................. 365/230.05; 365/233
(58) Field of Search ............................. 365/230.05, 233, 365/230.01

(56) References Cited

U.S. PATENT DOCUMENTS 5,835,417 * 11/1998 Ayukawa et al. .............. 365/189.04
5,973,955 * 10/1999 Nogle et al. ..................... 365/154
5,991,230 * 11/1999 Urakawa ......................... 365/233

* cited by examiner

*Primary Examiner*—David Nelms
*Assistant Examiner*—Hoai V. Ho
(74) *Attorney, Agent, or Firm*—Blakely, Sokoloff, Taylor & Zafman (57) ABSTRACT

A memory array structure includes a first word line connected to a single port memory cell and a dual port memory cell. The memory array structure also includes a second word line connected to the dual port memory cell. The second word line can control the data storage of the dual port memory during the second phase of a clock signal.

8 Claims, 7 Drawing Sheets

APPARATUS AND METHOD FOR OPERATING A DUAL PORT MEMORY CELL

FIELD OF THE INVENTION

The present invention relates to digital processing systems that include cache memories. More particularly, the present invention relates to an apparatus and method for operating a dual port memory cell in a digital processing system that includes cache memories.

BACKGROUND OF THE INVENTION

Digital processing systems often employ a cache memory to overcome the data transfer delay associated with communicating over an input/output ("I/O") bus. Digital processing systems also often employ a cache memory to overcome the slow operating speed of secondary memory devices (typically referred to as main memory) coupled to the I/O bus. In the prior art, the secondary memory devices typically consist of dynamic random access memories ("DRAMs") while the cache memories consist of static random access memories ("SRAMs").

Figure 1:
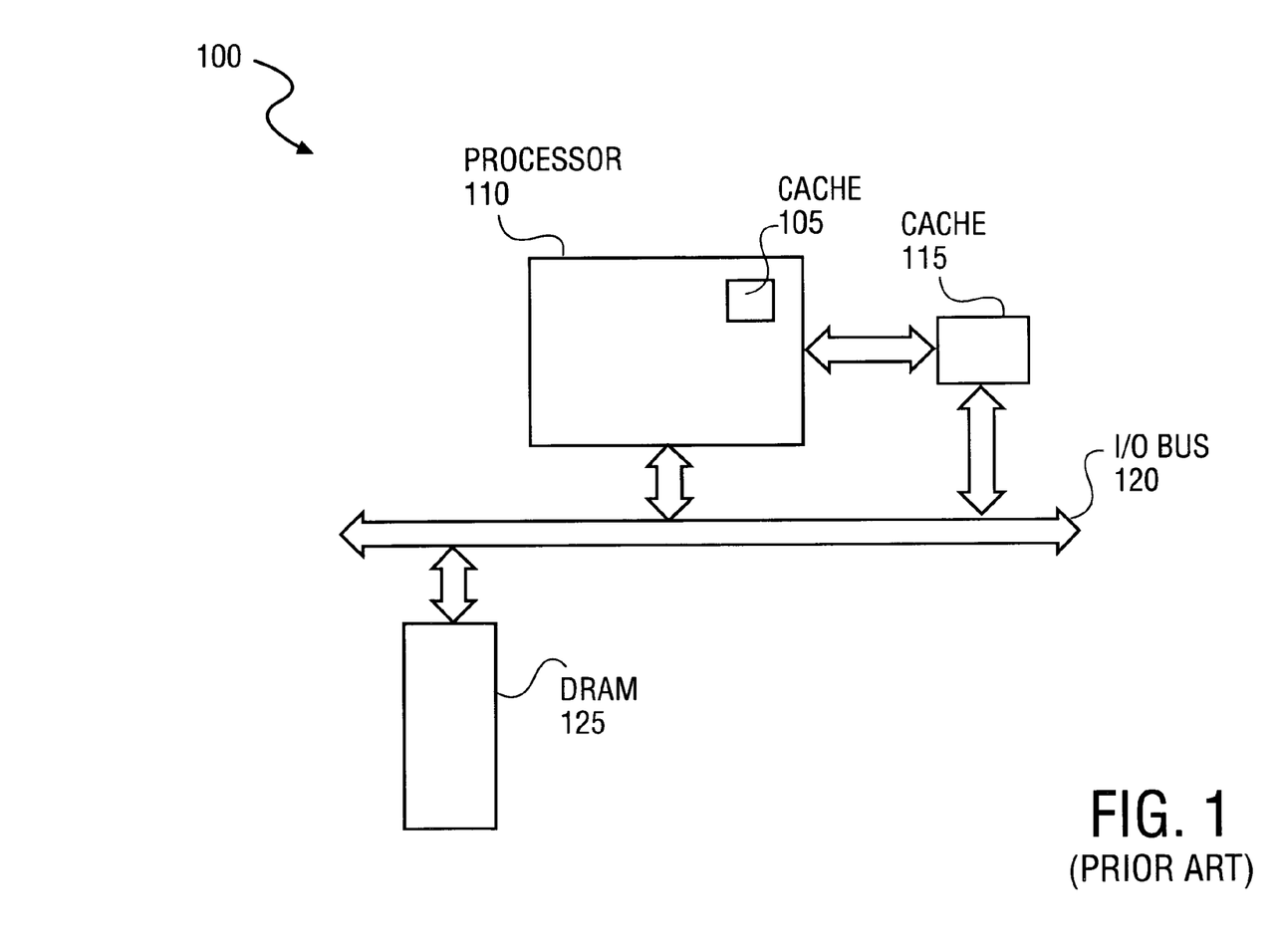
FIG. 1 shows a generalized example of a digital processing system using two cache memories.

FIG. 1 shows a generalized example of a digital processing system using two cache memories. In particular, system 100 comprises a processor (110) coupled to a main memory (DRAM 125) via I/O bus 120. System 100 also includes two cache memories (cache 105 and cache 115) coupled to processor 110. Cache 115, which is sometimes referred to as a level 2 cache, may be used to store a small subset of the data resident in DRAM 125. Similarly, cache 105, which is sometimes referred to as a level 1 cache, may also be used to store a small subset of the data resident in DRAM 125. Typically, cache 105 is located on the same semiconductor substrate which includes processor 110.

In system 100, cache 105 and cache 115 allow processor 110 to bypass data transfers along I/O BUS 120 by providing a temporary storage medium. To further bypass data transfers along I/O BUS 120, processor 110 can update cache 105 and cache 115 without updating DRAM 125—typically, when data is written only into a cache the cache is referred to as a write back cache. The use of write back caches, however, requires that processor 110 includes additional logic and memory cells in the caches. The memory cells added to the caches identify whether a specific group of cache memory cells (referred to as a cache line) have been updated—the data stored in the additional memory cells is typically referred to as a "dirty bit."

Figure 2:
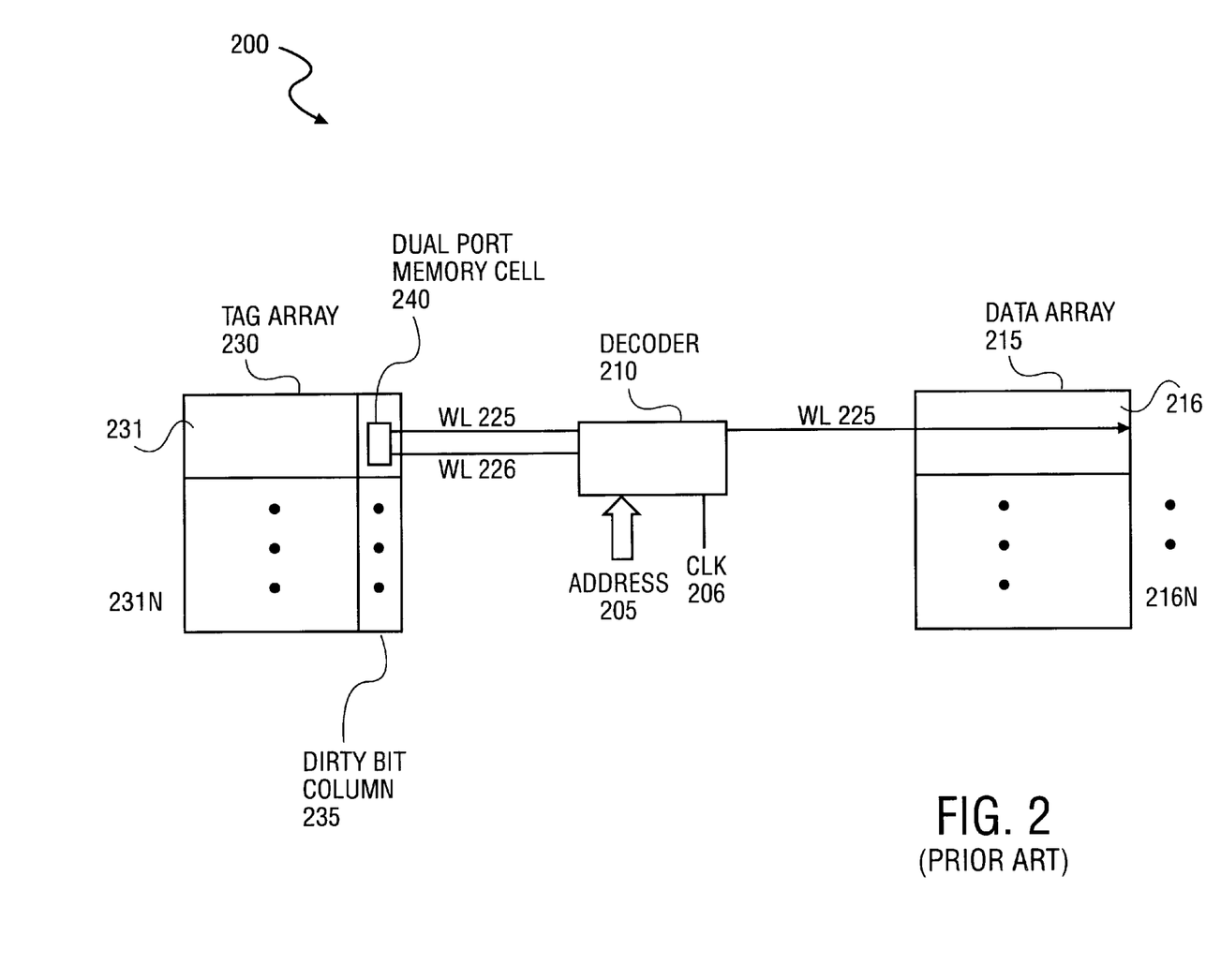
FIG. 2 shows a typical example of a write back cache memory.

FIG. 2 shows a typical example of a write back cache memory. In particular, cache 200 includes a tag array (230) and a data array (215) coupled to a decoder (210). Data array 215 includes a group of cache lines (216–216N) that store a copy of the data stored in main memory (for example DRAM 125 of FIG. 1). Similarly, tag array includes a group of tag lines (231–231N) that determine the main memory location associated with data stored in data array 215.

As illustrated in FIG. 2, cache 200 includes decoder 210. Decoder 210 includes an address (205) input and a clock (CLK 206) input. A processor (for example processor 110 of FIG. 1) coupled to cache 200 uses decoder 210 to store or retrieve data from cache 200. In particular, to access a cache line the processor generates a decoded address corresponding to a specific main memory address on address 205. In response to the decoded address, decoder 210 determines whether the main memory address resides within cache 200. Provided, the main memory address resides within cache 200, decoder 210 accesses a cache line in data array 215 and a tag line of tag array 230 via a word line.

FIG. 2 shows a word line (WL 225) used to access cache line 216 in data array 215 and tag line 231 in tag array 230. FIG. 2 also shows a dual port memory cell 240 included in tag line 231. Dual port memory cell 240 is coupled to decoder 210 via WL 225 and WL 226. Typically, dual port memory cell 240 stores a dirty bit indicating whether the information resident in the selected cache line is the updated version of the information resident in the main memory. Accordingly, the dirty bit allows a processor to determine which memory (main memory, a level one cache, or a level two cache) includes the most current data, thus reducing the chances of data corruption. For example, if a processor writes data to cache line 216, the processor sets the dirty bit value in dual port memory cell 240 to a first value until the data is transferred to main memory. Thus, the processor is able to determine which memory element includes the most current value by examining the values stored in dual port memory cells. Typically, dual port memory cells have three functional modes—a read/modify write mode, a read only mode, and a write only mode. During the read/modify write mode, the dirty bit of the dual port memory cell is read and re-written in one clock cycle.

One disadvantage of prior art cache systems results during a write only mode. Specifically, the data lines coupled to the dual port memory cell do not have a dedicated read and write capability.

Another disadvantage of prior art cache systems results in the operation of word lines coupled to the dual port memory. Specifically, the word lines coupled to the dual port memory have a clock phase relation that increases the logic size of the decoder coupled to the dual port memory cell.

SUMMARY OF THE INVENTION

A memory array structure is disclosed. The memory array structure comprises a first word line coupled to a single port memory cell and a dual port memory cell. The memory array structure also comprises a second word line coupled to the dual port memory cell. The second word line is operable to control the data storage of the dual port memory during the second phase of a clock signal.

For one embodiment, the memory array structure also comprises a decoder coupled to the dual port memory. The decoder has a plurality of data input lines and a plurality of data output lines. The memory array structure further comprises a control logic coupled to the decoder. The control logic is operable to transfer data to the dual port memory from the plurality of data output lines during the second phase of a clock signal controlling a write operation.

For another embodiment, the memory array structure further comprises a word line driver coupled to the first word line and the second word line. The word line driver is operable to control the signal transitions of the second word line during a write operation.

Other features and advantages of the present invention will be apparent from the accompanying drawings and from the detailed description that follows.

BRIEF DESCRIPTION OF THE DRAWINGS

The features and advantages of the present invention are illustrated by way of example and not limitations in the figures of the accompanying drawings in which like references indicate similar elements and in which.

DETAILED DESCRIPTION

A cache using a plurality of dual port memory cells with dedicated read and write lines is disclosed. A processor coupled to the cache uses a two phase clock signal to synchronize data storage and data retrieval from the cache. The processor also performs operations on the data stored in the plurality of dual port memory cells to indicate or determine whether cache lines associated with the plurality of dual port memory cells include valid or invalid data. It will be appreciated by one skilled in the art that the cache includes an array of cache lines, an array of dual port memory cells, an array of decoders, and an array of word lines. For illustrative purposes, however, the following description provides the logic and control signals associated with a single dual port memory cell.

For one embodiment, the processor performs a read, a write, or a read/modify write operation on a dual port memory cell. For an alternative embodiment, provided the processor performs a write operation, a word line driver is configured to control the writing of data to the dual port memory cell during the second phase of a clock signal. For another embodiment, control logic coupled to a decoder of the dual port memory ensures that data is written into the dual port memory during the second phase of the clock. Thus, an intended advantage of an embodiment of the invention is to reduce the size of a dual port memory cell decoder via a control logic and a word line driver coupled to the decoder and the dual port memory cell, respectively.

Another intended advantage of an embodiment of the invention is to reduce the size of a dual port memory cell decoder via a dual port memory cell with dedicated read and write data lines. Yet another intended advantage of an embodiment of the invention is to generate a dual port word line that transitions during the second phase of a cache write cycle. Thus, the dual port word line ensures that the data from the decoder is written to the dual port memory cell during the second phase of a write clock cycle.

Figure 3:
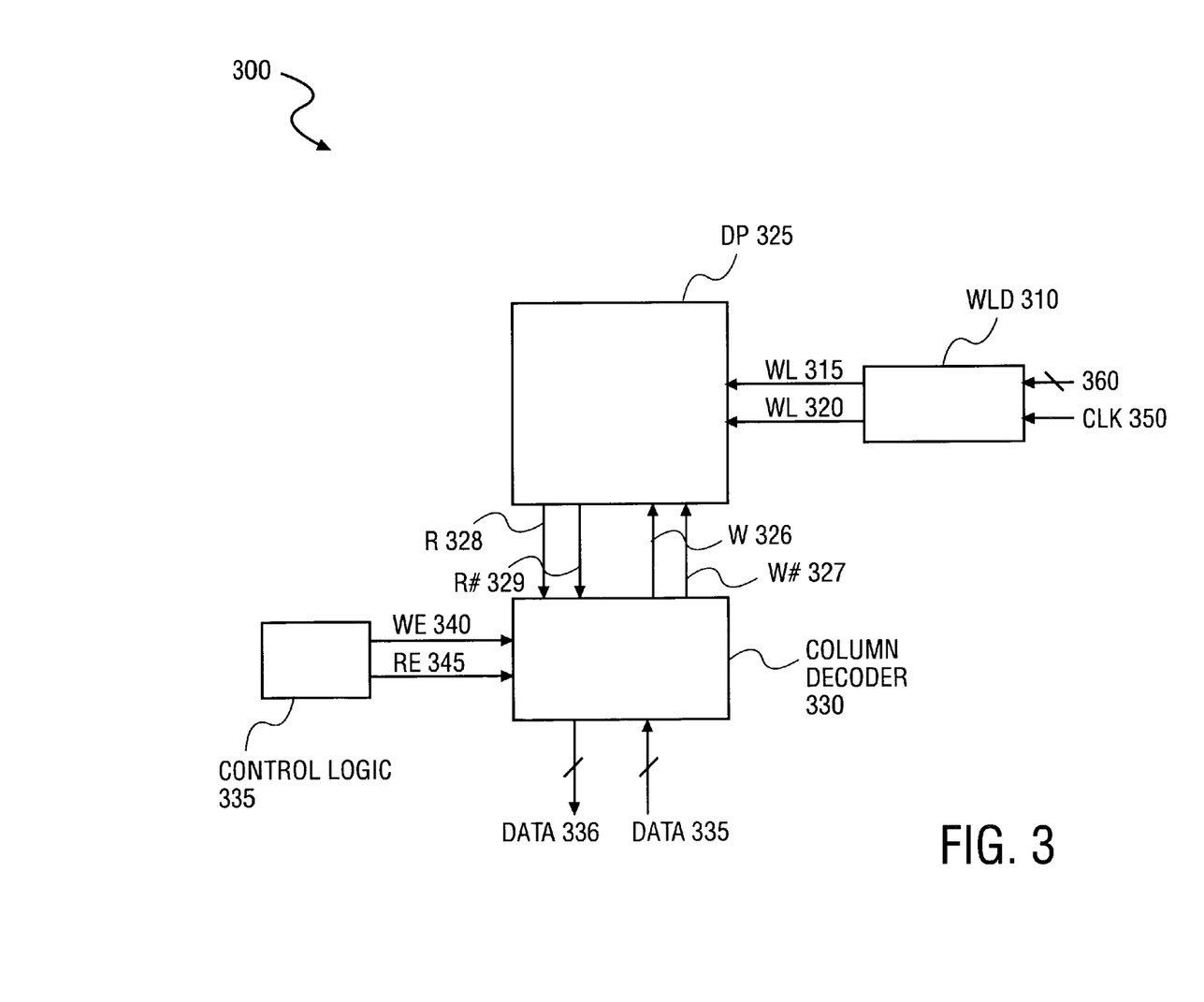
FIG. 3 illustrates one embodiment of a dual port memory cell decoder and word line driver.

FIG. 3 illustrates one embodiment of a dual port memory cell decoder and a word line driver. In particular, system 300 comprises a dual port memory cell (DP 325) coupled to a word line driver (WLD 310) and a column decoder (330). WLD 310 is coupled to inputs 360 and CLK 350. For one embodiment, system 300 is coupled to a processor (not shown) via inputs 360 and CLK 350. Specifically, the processor generates a decoded address on input 360 to perform a read, write, or read/modify write operation on the data stored in DP 325. Additionally, the processor uses CLK 350 to synchronize read, write, and read/modify write operations on DP 325.

System 300 also comprises control logic 335 coupled to column decoder 330. Column decoder 330, in turn, is coupled to input data 336 and output data 335. For one embodiment, data 336 and data 335 comprises multiple bit lines that are coupled to sense amplifiers (not shown) and write drivers (not shown), respectively. The sense amplifiers are used to read the data stored in DP 325. Alternatively, the write drivers are used to write data into DP 325.

As illustrated in FIG. 3, DP 325 is coupled to WLD 310 via word lines WL 315 and WL 320. For one embodiment, WL 315 and WL 320 are used to read data from DP 325 and write data into DP 325. In particular, WL 315 controls the transfer of data from DP 325 onto lines R328 and R#329. WL 320, on the other hand, control the transfer of data from lines W326 and W#327 into DP 325. For an alternative embodiment, during a write operation WL 320 transitions in the second phase of CLK 350. Thus, in a write operation data is written into DP 325 during the second phase of CLK 350.

For another embodiment, system 300 is coupled to a data array single port memory cell (not shown) via WL 315. Accordingly, WL 320 is a dual port word line that controls the writing of data into DP 325. WL 315, however, is responsible for the writing of data into the single port memory cell, the reading of data from the single port memory cell, and the reading of data from DP 325. Thus, the generation of a dual port word line (WL 320) that transitions during a second phase of a write operation allows a reduced decoder (column decoder 330) size because in a write operation WL 315 is used solely to control the operation of the single port memory cell.

For yet another embodiment, DP 325 comprises a pair of cross-coupled inverters. Thus, the data on R#329 is the logical inverse of the data on R328 and both R328 and R#329 form the first port of DP 325. Similarly, the data on W#327 is the logical inverse of the data on W326 and both W326 and W#327 form the second port of DP325.

As further illustrated in FIG. 3, DP 325 is also coupled to column decoder 330 via lines R328, R#329, W326, and W#327. For one embodiment, lines R328 and R#329 are dedicated read lines. Accordingly, column decoder 330 selectively couples data 336 to lines R328 and R#329 based on a read enable (RE 345) control signal generated by control logic 335. For an alternative embodiment, lines W326 and W#327 are dedicated write lines. Accordingly, column decoder 330 selectively couples lines W326 and W#327 to data 335 based on a write enable (WE 340) control signal generated by control logic 335.

Figure 4:
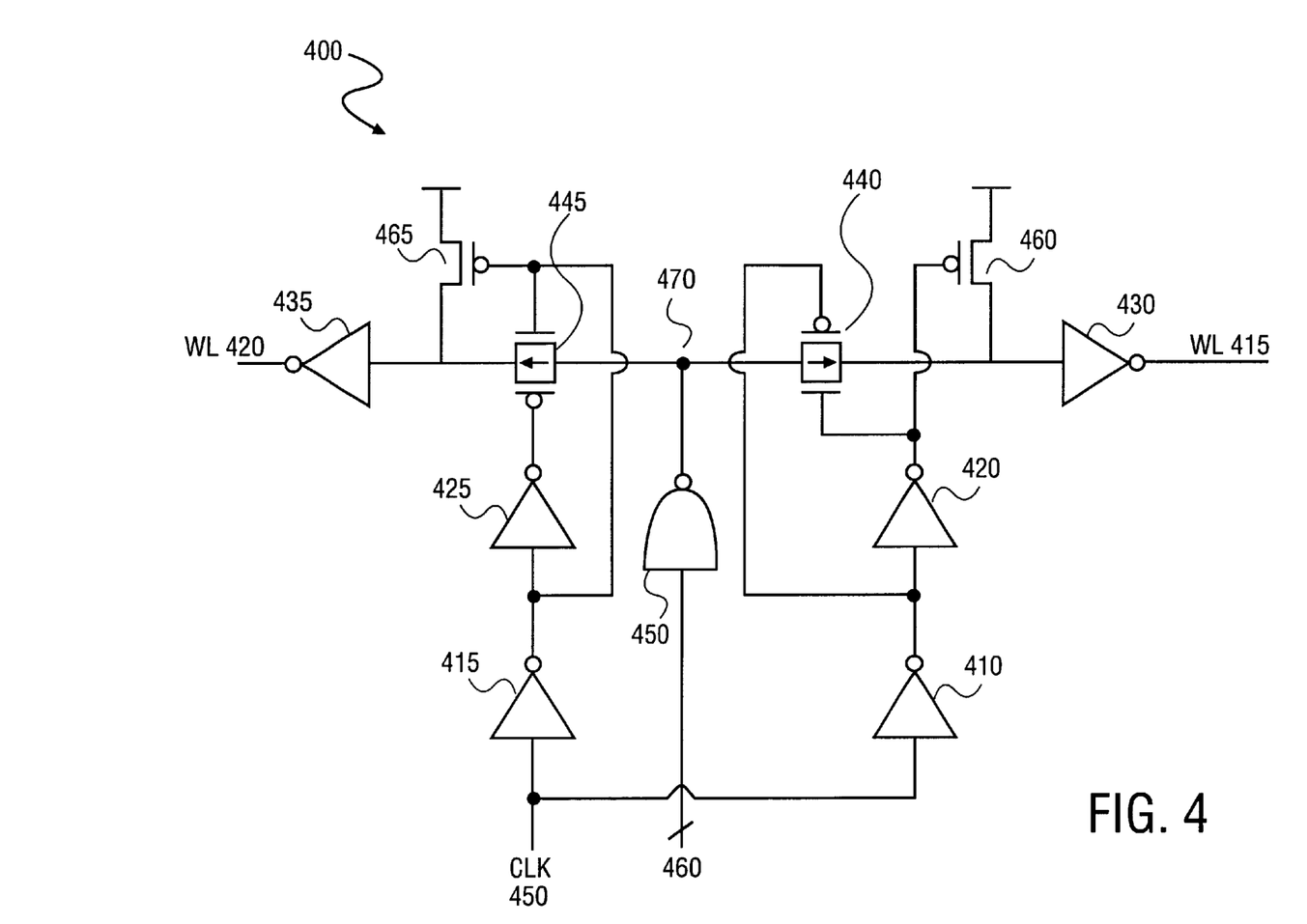
FIG. 4 illustrates one embodiment of a word line driver.

FIG. 4 illustrates one embodiment of a word line driver. In particular, word line driver 400 generates two word lines WL 420 and WL 415 based on inputs CLK 450 and 460. For one embodiment, word line driver 400 is coupled to a processor (not shown). Thus, the processor uses CLK 450 to synchronize communications between the processor and word line driver 400. The processor also generates a set of decoded address line on input 460 to select word line driver 400. If the decoded address values select word line driver 400, NAND gate 450 generate a logic '0' value on node 470. If the decoded address values does not select word line driver 400, NAND gate 450 generates a logic '1' value on node 470. For another embodiment, word line driver 400 corresponds to WLD 310 of system 300. Accordingly, WL 420 corresponds to WL 320, WL 415 corresponds to WL 315, CLK 450 corresponds to CLK 350, and input 460 corresponds to input 360.

As further illustrated in FIG. 4, input CLK 450 is coupled to inverter 415 which, in turn, is coupled to inverter 425, transistor 465, and a first gate of pass gate 445. Inverter 425 is coupled to the second gate of passgate 445. FIG. 4 also illustrates that the two transmission points of passgate 445 are coupled to node 470 and inverter 435. Inverter 435 drives WL 420. The coupling of CLK 450 to WL 420 ensures that the logical inverse of the data on node 470 is transferred to WL 420 during the second phase of CLK 450.

Input CLK 450 is also coupled to inverter 410 which, in turn, is coupled to inverter 420, transistor 460, and a second gate of pass gate 440. The output of inverter 420 is coupled to the first gate of passgate 440. FIG. 4 also illustrates that the two transmission points of passgate 440 are coupled to node 470 and inverter 430. Inverter 430 drives WL 415. The coupling of CLK 450 to WL 415 ensures that the logical inverse of the data on node 470 is transferred to WL 415 during the first phase of CLK 450.

Figure 5:
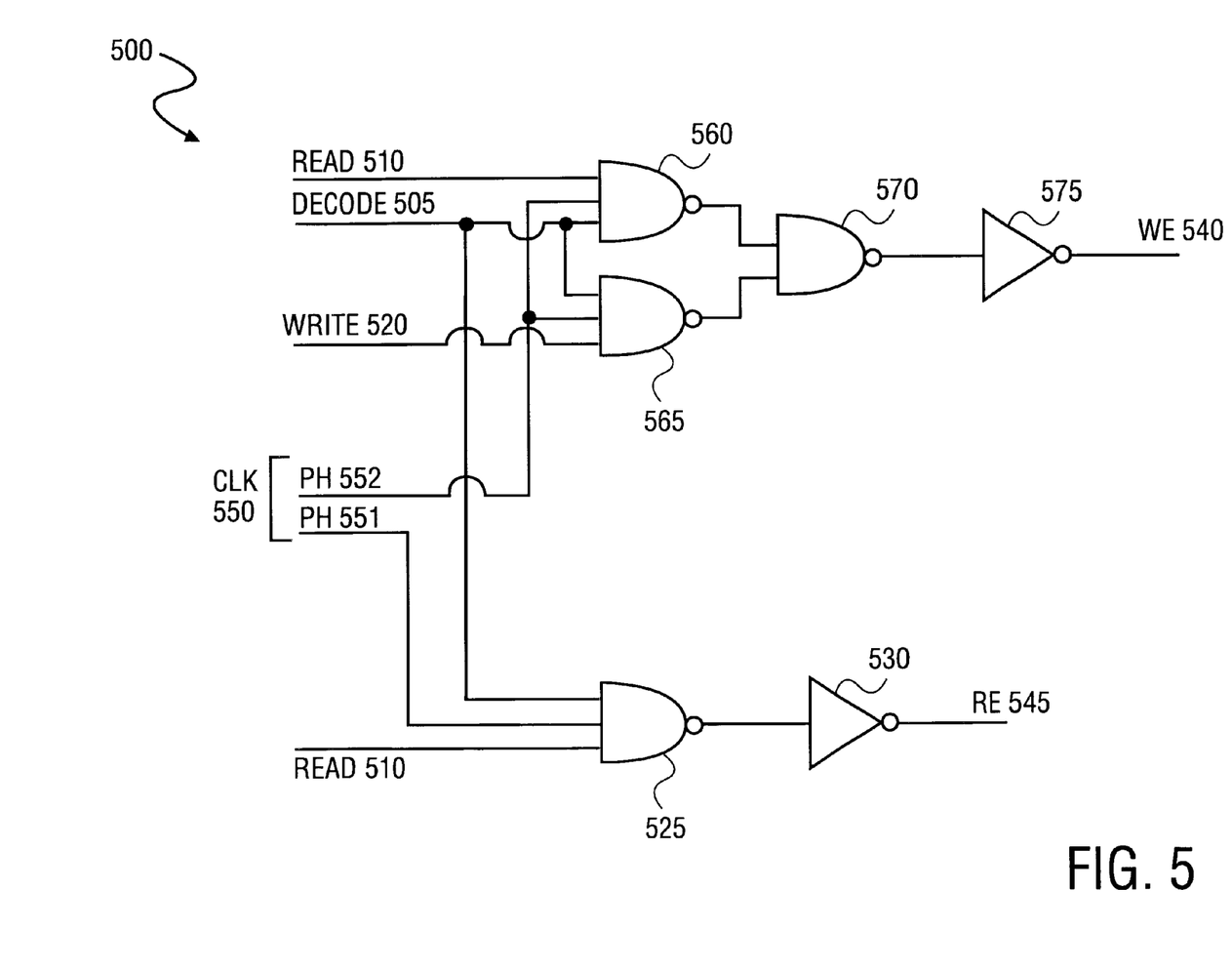
FIG. 5 illustrates one embodiment of a control logic used to determine, a write, read, or read/modify write operation.

FIG. 5 illustrates one embodiment of a control logic used to determine a write, read, or read/modify write operation. In particular, control logic 500 includes inputs READ 510, WRITE 520, CLK 550, and DECODE 505. Control logic 500 also includes outputs WE 540 and RE 545. As illustrated in FIG. 5, CLK 550 comprises signals PH 551 and PH 552. For one embodiment, CLK 550 comprises a two phase clock signal. Accordingly, PH 551 comprises a signal line carrying the first phase of the clock signal and PH 552 comprises a signal line carrying the second phase of the clock signal.

For one embodiment, control logic 500 is coupled to a processor (not shown). Thus, the processor uses CLK 550 to synchronize communications between the processor and control logic 500. The processor also generates data on READ 510 and WRITE 520 to determine an operation. Specifically, during a write operation the processor generates a logic '1' value on WRITE 520 and a logic '0' value on READ 510. During a read operation the processor generates a logic '0' value on WRITE 520 and a logic '1' value on READ 510. During a read/modify write the processor generates a logic '1' value on READ 510. Additionally, in the event control logic 500 is used in a multi-controller array, the processor may also disable control logic 500 via a logic '0' value on input DECODER 505. For another embodiment, control logic 500 corresponds to control logic 335 of system 300. Accordingly, WE 540 corresponds to WE 340, RE 545 corresponds to RE 345, and CLK 550 corresponds to CLK 350.

As further illustrated in FIG. 5, output RE 545 is generated by inverter 530. The input of inverter 530 is coupled to the output of NAND gate 525 which has three inputs coupled to READ 510, PH 551 and DECODE 505. Output WE 540 is also generated by an inverter (575). The input of inverter 575, however, is coupled to the output of NAND gate 570 whose inputs are generated by the output of NAND gate 560 and the output of NAND gate 564. The inputs to NAND gate 560 are READ 510, DECODE 505, and PH 552. The inputs to NAND gate 565 are WRITE 520, DECODE 505, and PH 552.

For one embodiment, control logic 500 is coupled to a column decoder of a dual port memory cell. The WE 540 signals generated by control logic 500 ensure that column decoder transfers data to the dual port memory cell during the second phase of a write operation. Thus, the logic included in the column decoder is reduced because of the selective data transfer created by the control signals of control logic 500.

Figure 6:
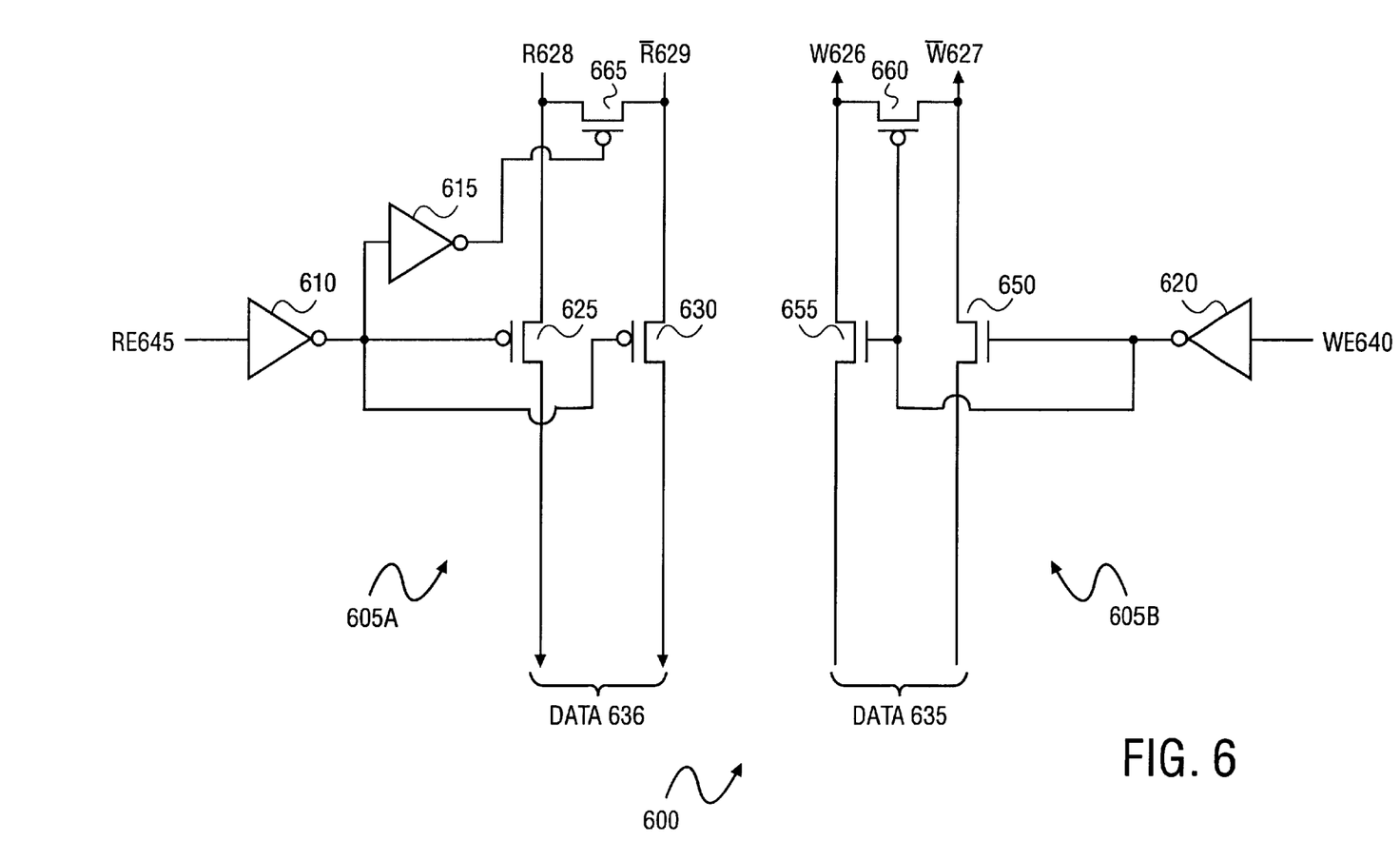
FIG. 6 illustrates one embodiment of a column decoder.

FIG. 6 illustrates one embodiment of a column decoder. In particular, decoder 600 includes a read path 605A and a write path 605B. For one embodiment, decoder 600 corresponds to column decoder 330 of system 300. Accordingly, WE 640 corresponds to WE 340, RE 645 corresponds to RE 345, DATA 635 corresponds to DATA 335, and DATA 636 corresponds to DATA 336. Additionally, W626 corresponds to W326, W#627 corresponds to W#327, R628 corresponds to R328, and R#629 corresponds to R#329.

As further illustrated in FIG. 6, read path 605A includes an inverter 610 with RE 645 as an input. The output of inverter 610 is coupled to inverter 615, the gate of transistor 625, and the gate of transistor 630. The source of transistor 625 is coupled to input R628 and the drain of transistor 625 is coupled to data 636. Similarly, the source of transistor 630 is coupled to input R#629 and the drain of transistor 630 is coupled to data 636. Finally, the output of inverter 615 is coupled to the gate of transistor 665 whose source and drain are coupled to R628 and R#629, respectively.

Write path 605B includes an inverter 620 with WE 640 as an input. The output of inverter 620 is coupled to the gate of transistor 650, the gate of transistor 655, and the gate of transistor 660. The source of transistor 655 is coupled to input W626 and the drain of transistor 625 is coupled to data 635. Similarly, the source of transistor 650 is coupled to input W#627 and the drain of transistor 650 is coupled to data 635. Finally, the source and drain of transistor 660 are coupled to W626 and W#627, respectively.

For one embodiment, column decoder 600 is used in an array of multiple decoders. Accordingly, the dedicated read and write paths in conjunction with the control signals RE 645 and WE 640 allow for a simplified decoder design that reduces the sizes of the decoder array. For an alternative embodiment, WE 640 ensures that during a write operation data transferred from data 635 to a dual port memory cell (not shown) occurs during the second phase of a processor clock.

Figure 7:
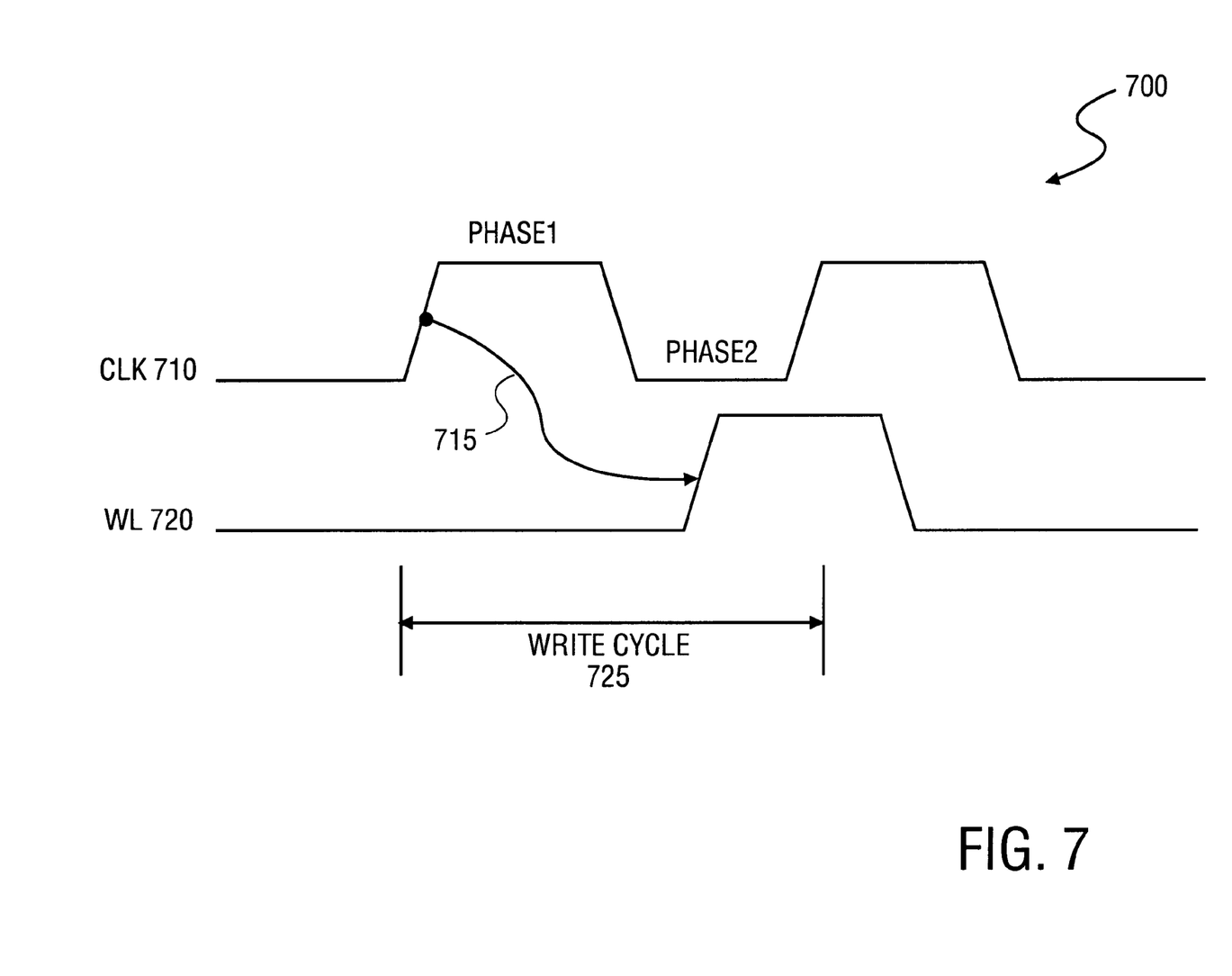
FIG. 7 shows a timing diagram illustrating a write operation.

FIG. 7 shows a timing diagram illustrating a write operation. In particular, timing diagram 700 illustrates the relationship between clock signal CLK 710 and a dual port word line (WL 720). The transition of WL 720 with regards to the rising clock edge of CLK 710 is illustrated by line 715. As shown in FIG. 7, during write cycle 725, WL 720 transitions to a logic '1' state only during the second phase of clock 710. For example, for one embodiment, WL 720 corresponds to WL 320 of system 300. Furthermore, CLK 710 (also shown as CLK 350 in system 300) corresponds to a processor clock signal used to synchronize data transfer between the processor, a cache including system 300, and a single port memory of a data array. Thus, the transition of WL 720 during the second phase of a write operation allows a reduced decoder (column decoder 330) size because in a write operation the secondary word line driver (WL 315) is used solely to control the operation of the single port memory cell.

Thus, an apparatus and method for operating a dual port memory cell have been provided. Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A memory array structure, the memory array comprising:
    a first word line coupled to a single port memory cell and a dual port memory cell; and
    a second word line coupled to the dual port memory cell wherein the second word line is operable to control a data storage of the dual port memory during a second phase of a clock signal controlling a write operation, and wherein the second word line is operable to transition during the second phase of the clock signal.

2. The memory array structure of claim 1, wherein the second word line is further operable to control a data transfer to the dual port memory during the second phase of the clock signal controlling the write operation.

3. The memory array structure of claim 1, further comprising:
   a decoder coupled to the dual port memory, the decoder having a plurality of data input lines and a plurality of data output lines; and
   a control logic coupled to the decoder, wherein the control logic is operable to transfer data to the dual port memory from the plurality of data output lines during the second phase of the clock signal controlling the write operation.

4. The memory array structure of claim 3, further comprising a word line driver coupled to the first word line and the second word line, wherein the word line driver is operable to control signal transitions of the second word line during the write operation.

5. The memory array structure of claim 4, wherein the word line driver comprises logic circuitry coupled to the clock signal and a plurality of address inputs, wherein the logic circuitry is configured to transition the second word line to a logic high state during the second phase of the clock signal controlling the write operation.

6. The memory array structure of claim 4, wherein the word line driver comprises logic circuitry coupled to the clock signal and a plurality of address inputs, wherein the logic circuitry is configured to transition the second word line to a logic low state during the second phase of the clock signal controlling the write operation.

7. A method of writing data to a dual port memory cell, the method comprising a first word line signal operable to transfer data from a data input to the dual port memory cell, wherein the first word line signal is configured to transition during a second phase of a clock signal controlling the write operation;
   generating a second word line signal, wherein the second word line signal is operable to read data from the dual port memory cell; and
   wherein the second word line signal is further operable to read data into the single port memory cell.

8. The method of claim 7, wherein the second word line signal is further operable to write data into the single port memory cell.

* * * * *